US012525569B2

(12) United States Patent
Yamano (10) Patent No.: US 12,525,569 B2
(45) Date of Patent: Jan. 13, 2026

(54) SEMICONDUCTOR DEVICE AND SEMICONDUCTOR CHIP

(71) Applicant: FUJI ELECTRIC CO., LTD., Kawasaki (JP)

(72) Inventor: Akio Yamano, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 750 days.

(21) Appl. No.: 17/852,685

(22) Filed: Jun. 29, 2022

(65) Prior Publication Data

US 2022/0328444 A1   Oct. 13, 2022

Related U.S. Application Data

(63) Continuation of application No. PCT/JP2021/020532, filed on May 28, 2021.

(30) Foreign Application Priority Data

Jul. 10, 2020   (JP) .................................. 2020-119388

(51) Int. Cl.
*H01L 23/00* (2006.01)
*H01L 25/07* (2006.01)

(52) U.S. Cl.
CPC ............ *H01L 24/48* (2013.01); *H01L 25/072* (2013.01); *H01L 2224/48139* (2013.01); *H01L 2924/13055* (2013.01); *H01L 2924/3861* (2013.01)

(58) Field of Classification Search
CPC ......... H01L 24/48; H01L 24/05; H01L 24/32; H01L 24/73; H01L 24/92; H01L 24/06;
(Continued)

(56) References Cited

U.S. PATENT DOCUMENTS 6,222,266 B1   4/2001  Kohno
2006/0244116 A1*  11/2006  Tsunoda ................. H01L 24/37
                                                        257/E21.515
(Continued)

FOREIGN PATENT DOCUMENTS

EP        0905791 A2    3/1999
JP     H11-103051 A     4/1999
(Continued)

OTHER PUBLICATIONS

International Search Report for PCT/JP2021/020532, mailed on Aug. 31, 2021.
Written Opinion for PCT/JP2021/020532, mailed on Aug. 31, 2021.

*Primary Examiner* — Teresa M. Arroyo
(74) *Attorney, Agent, or Firm* — Rabin & Berdo, P.C.

(57) ABSTRACT

A semiconductor device includes a first semiconductor chip including a plurality of first control electrodes, each of which is disposed at a respective one of corner portions on a first front surface thereof, a first output electrode disposed on the first front surface, and a first input electrode disposed on a first rear surface thereof, a second semiconductor chip including a plurality of second control electrodes, each of which is disposed at a respective one of corner portions on a second front surface thereof, a second output electrode disposed on the second front surface, and a second input electrode disposed on a second rear surface thereof, the second semiconductor chip being disposed adjacent to the first semiconductor chip, and a first connection wire which connects one of the first control electrodes and one of the second control electrodes.

15 Claims, 8 Drawing Sheets

(58) Field of Classification Search
CPC ....... H01L 24/49; H01L 25/072; H01L 25/18; H01L 23/3735; H01L 2224/48139; H01L 2224/05553; H01L 2224/0603; H01L 2224/32225; H01L 2224/48227; H01L 2224/49175; H01L 2224/48137; H01L 2224/4846; H01L 2224/49111; H01L 2224/49113; H01L 2224/73265; H01L 2224/92247; H01L 2924/00014; H01L 2924/13055; H01L 2924/3861

See application file for complete search history.

(56) References Cited

U.S. PATENT DOCUMENTS

| | | |
|---|---|---|
| 2013/0155745 A1 | 6/2013 | Tanaka et al. |
| 2013/0249008 A1 | 9/2013 | Sugimura et al. |
| 2014/0284617 A1* | 9/2014 | Sakiyama ............... H01L 25/18 |
| | | 257/784 |
| 2017/0287828 A1* | 10/2017 | Sawada ............. H01L 23/49844 |
| 2018/0190636 A1* | 7/2018 | Mukunoki .............. H01L 24/48 |
| 2018/0204778 A1 | 7/2018 | Hasegawa et al. |
| 2018/0261713 A1* | 9/2018 | Tadakuma ............ H02M 7/537 |
| 2020/0395343 A1* | 12/2020 | Kakefu ................... H01L 24/49 |
| 2021/0143132 A1* | 5/2021 | Kakefu ................... H02M 1/32 |

FOREIGN PATENT DOCUMENTS

| | | |
|---|---|---|
| JP | 2004-363339 A | 12/2004 |
| JP | 2005-327752 A | 11/2005 |
| JP | 2013-125806 A | 6/2013 |
| WO | 2013/140928 A1 | 9/2013 |
| WO | 2017/029748 A1 | 2/2017 |
| WO | 2017/056176 A1 | 4/2017 |
| WO | 2020/059285 A1 | 3/2020 |

\* cited by examiner

SEMICONDUCTOR DEVICE AND SEMICONDUCTOR CHIP

CROSS-REFERENCE TO RELATED APPLICATION

This application is a continuation application of International Application PCT/JP2021/020532 filed on May 28, 2021 which designated the U.S., which claims priority to Japanese Patent Application No. 2020-119388, filed on Jul. 10, 2020, the entire contents of which are incorporated herein by reference.

BACKGROUND OF THE INVENTION

1. Field of the Invention

The present embodiments relate to a semiconductor device and a semiconductor chip.

2. Background of the Related Art

Semiconductor devices include power devices. These power devices are, for examples, semiconductor chips including insulated gate bipolar transistors (IGBTs) or power metal-oxide semiconductor-field-effect transistors (MOSFETs). Such a semiconductor device includes a plurality of ceramic circuit boards on which the semiconductor chips as described above are disposed and a heat dissipation board on which the ceramic circuit boards are disposed. In addition, the control electrodes of the semiconductor chips, the main electrodes of the semiconductor chips, and circuit patterns on the ceramic circuit boards are electrically connected, as needed, by bonding wires. In this way, the semiconductor device achieves its desired function (for example, see Japanese Laid-open Patent Publication No. 2004-363339).

When a semiconductor device is manufactured, a bonding wire included in the semiconductor device could come into contact with an object and fall down. For example, there is a high possibility that a bonding wire connecting the control electrodes of semiconductor chips connected in parallel to each other comes into contact with an object. In particular, when a control electrode of a semiconductor chip is located at an end portion of a ceramic circuit board, there is a higher possibility that the corresponding bonding wire comes into contact with an object. If such a bonding wire that is connected to a control electrode falls down and comes into contact with a bonding wire connected to a main electrode, this semiconductor device suffers an electrical failure and fails to achieve its desired function.

SUMMARY OF THE INVENTION

According to an aspect, there is provided a semiconductor device, including: a first semiconductor chip having a first front surface and a first rear surface opposite to each other, and including a plurality of first control electrodes, each of which is disposed at a respective one of corner portions on the first front surface, a first output electrode disposed on the first front surface, and a first input electrode disposed on the first rear surface; a second semiconductor chip having a second front surface and a second rear surface opposite to each other, and including a plurality of second control electrodes, each of which is disposed at a respective one of corner portions on the second front surface, a second output electrode disposed on the second front surface, and a second input electrode disposed on the second rear surface, the second semiconductor chip being disposed adjacent to the first semiconductor chip; and a first connection wire, which connects one of the first control electrodes and one of the second control electrodes.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device 10 in FIG. 1, terms "front surface" and "top surface" each mean an upward surface. Likewise, regarding the semiconductor device 10 in FIG. 1, a term "up" means an upward direction. Regarding the semiconductor device 10 in FIG. 1, terms "rear surface" and "bottom surface" each mean a downward surface. Likewise, regarding the semiconductor device 10 in FIG. 1, a term "down" means a downward direction. In the other drawings, too, the above terms mean their respective directions, as needed. The terms "front surface", "top surface", "up", "rear surface", "bottom surface", "down", and "side surface" are only used for the purpose of convenience to express relative positional relationships and do not limit the technical concept of the embodiments. For example, the terms "up" and "down" may mean directions other than the vertical directions with respect to the ground. That is, the directions expressed by "up" and "down" are not limited to the directions relating to the gravitational force. In the following description, when a component contained in material represents 80 vol % or more of the material, this component may be referred to as the "main component" of the material.

First Embodiment

Figure 1:
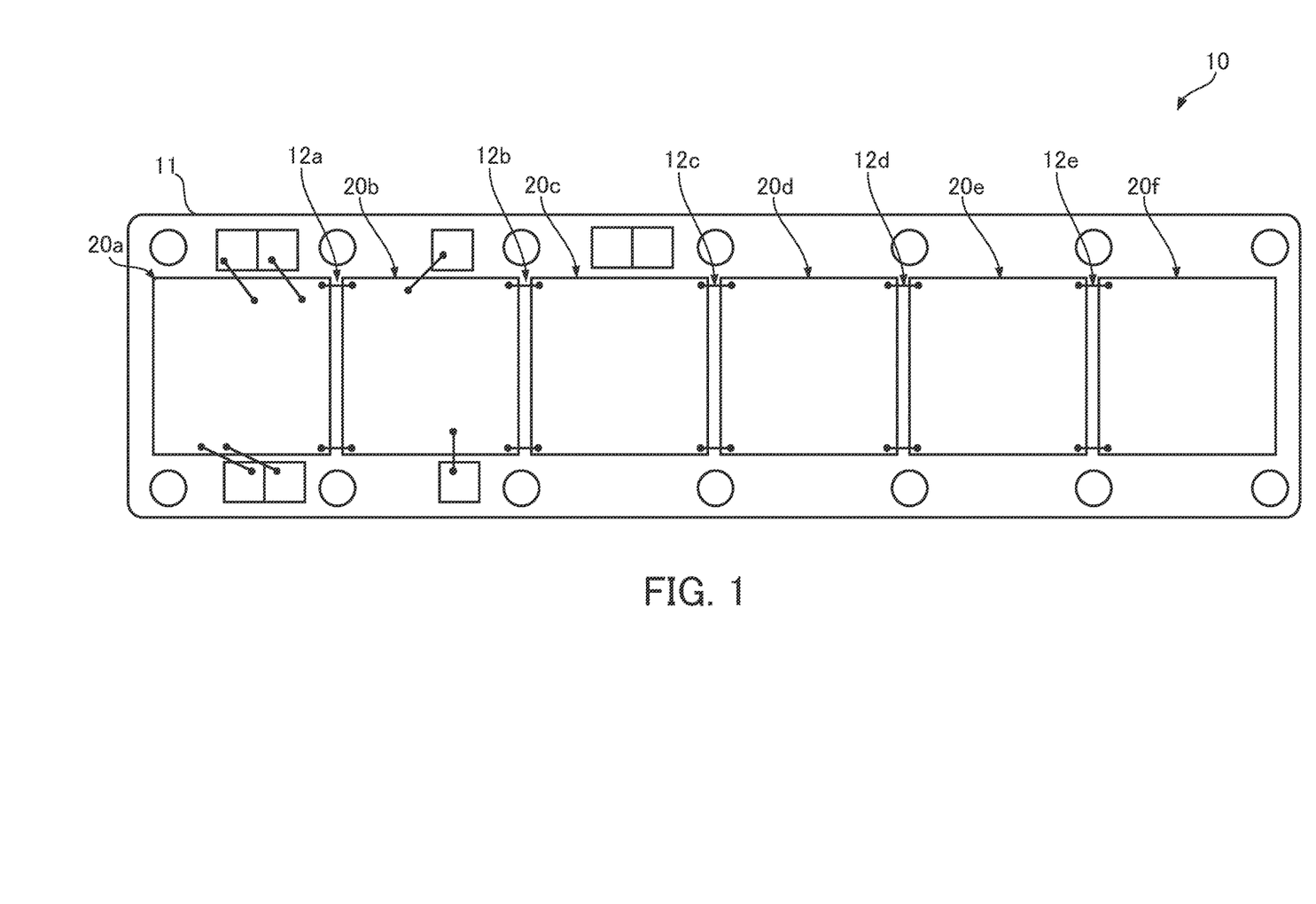
FIG. 1 is a plan view of a semiconductor device according to a first embodiment.

Hereinafter, a semiconductor device according to a first embodiment will be described with reference to drawings. FIG. 1 is a plan view of a semiconductor device according to a first embodiment. A semiconductor device 10 includes a heat dissipation board 11 and semiconductor units 20a to 20f electrically connected to contact areas (which will be described below) on the heat dissipation board 11 via bonding wires 12a to 12e.

The heat dissipation board 11 is made of metal material having excellent thermal conductivity as its main component. The metal material is, for example, aluminum, iron, silver, copper, or an alloy containing at least one of these kinds. Plating or the like may be performed so that nickel covers the surface of the heat dissipation board 11. In this way, the corrosion resistance of the heat dissipation board 11 is improved. Specifically, a nickel-phosphorus alloy or a nickel-boron alloy may be used, in place of nickel. Further, attachment holes used for attaching the semiconductor device to an external device and contact areas for causing a current to flow to and from the semiconductor units 20a to 20f are suitably formed in the heat dissipation board 11.

The heat dissipation board 11 is made of metal material having excellent thermal conductivity as its main component. The metal material is, for example, aluminum, iron, silver, copper, or an alloy containing at least one of these kinds. In addition, contact areas are formed in the heat dissipation board 11. The contact areas are electrically connected to the semiconductor units 20a to 20f via bonding wires. In addition, the contact areas are electrically connected to an external element. Thus, the external element is electrically connected to the semiconductor units 20a to 20f via the contact areas.

In addition, bolt holes into which bolts are screwed are formed in the front surface of the heat dissipation board 11. By screwing bolts into these bolt holes, the semiconductor device 10 is attached to an external device or a cooling unit. Attachment of a cooling unit will be described below. The surface of the heat dissipation board 11 may be plated to improve its corrosion resistance. In this case, for example, the plating material contains nickel, a nickel-phosphorus alloy, or a nickel-boron alloy as its main component.

The semiconductor units 20a to 20f are disposed in a line in a predetermined direction on the front surface of the heat dissipation board 11 via, for example, solder or silver solder. These semiconductor units 20a to 20f include semiconductor chips including predetermined power devices and have needed functions. The semiconductor units 20a to 20f illustrated in FIG. 1 are disposed in a line, and the number of semiconductor units 20a to 20f may be determined as needed. Hereinafter, the semiconductor units 20a to 20f will collectively be referred to as semiconductor units 20, and details thereof will be described below. The bonding wires 12a to 12e are each made of metal material having excellent electrical conductivity as its main component. Examples of the metal material include gold, silver, copper, aluminum, and an alloy containing at least one of these kinds. The bonding wires 12a to 12e each have a diameter, for example, between 100 μm and 1 mm, inclusive.

In addition, a cooling unit may be attached to the rear surface of the heat dissipation board 11 of the semiconductor device 10 via thermal grease. The thermal grease is, for example, silicone in which filler of metal oxide is mixed. This cooling unit is also made of material having excellent thermal conductivity as its main component, and as needed, the surface of the cooling unit may be plated. The cooling unit is, for example, a heat sink having a plurality of fins or a water-cooled cooling device. The heat dissipation board 11 may be formed integrally with such a cooling unit as described above.

In addition, after electrically connected via wiring members, the semiconductor units 20a to 20f and the heat dissipation board 11 may be stored in a case (not illustrated). The wiring members are, for example, lead frames. In this case, the control terminals and external terminals of the lead frames are exposed to the outside from the case. A control signal is inputted via the individual control terminal. A predetermined current is caused to flow through the individual external terminal with respect to the outside. The case is made of thermoplastic resin as its main component. Examples of the thermoplastic resin include polyphenylene sulfide resin, polybutylene terephthalate resin, polybutylene succinate resin, polyamide resin, and acrylonitrile butadiene styrene resin.

Figure 2:
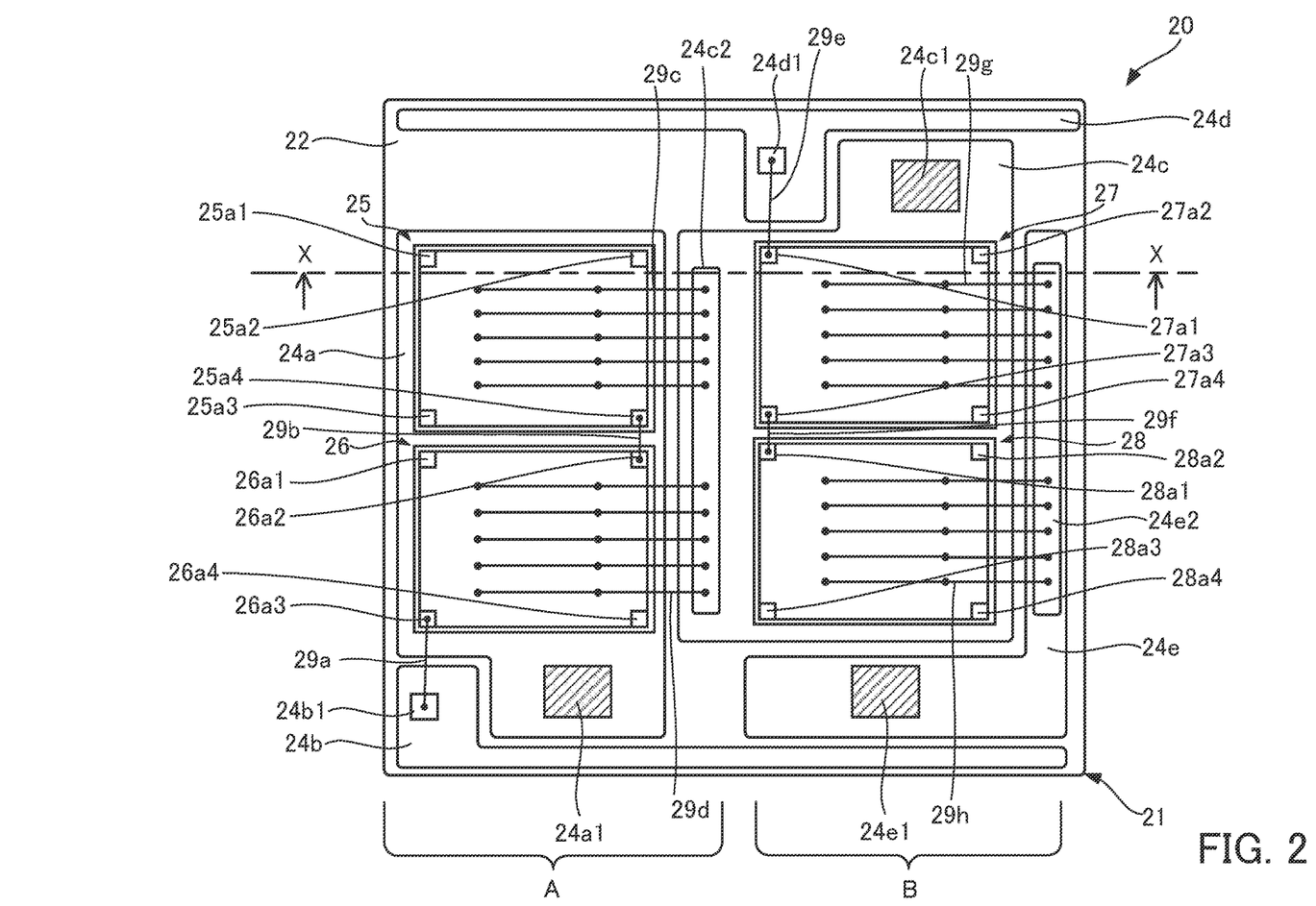
FIG. 2 is a plan view of a semiconductor unit according to the first embodiment.
Figure 3:
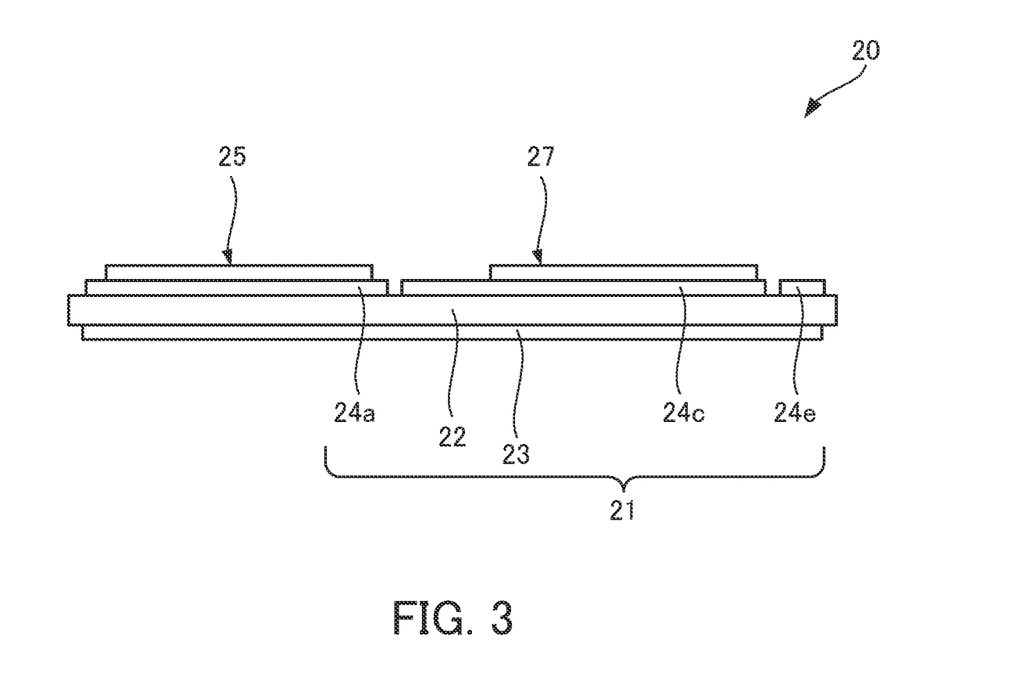
FIG. 3 is a sectional view of the semiconductor unit according to the first embodiment.
Figure 4A:
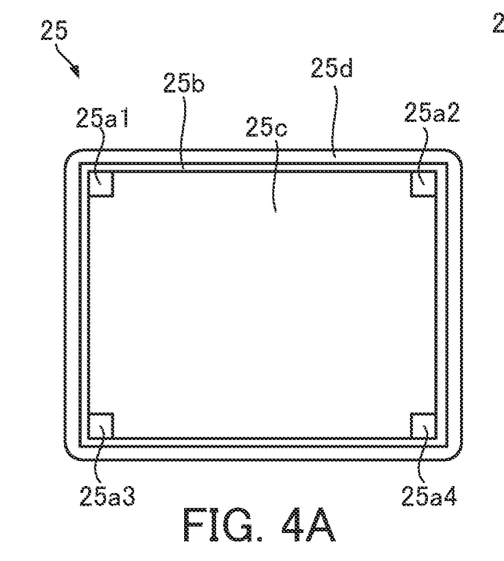
FIGS. 4A to 4D are plan views of semiconductor chips included in the semiconductor unit according to the first embodiment.
Figure 4B:
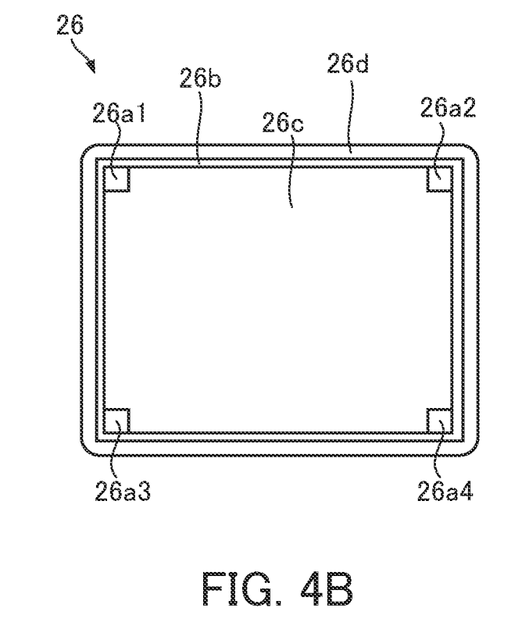
Figure 4C:
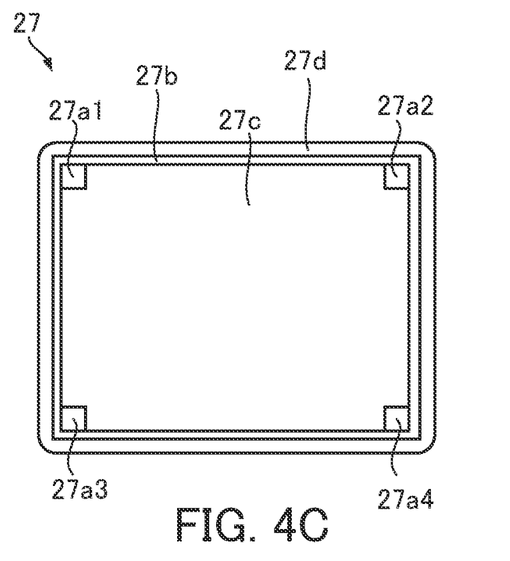
Figure 4D:
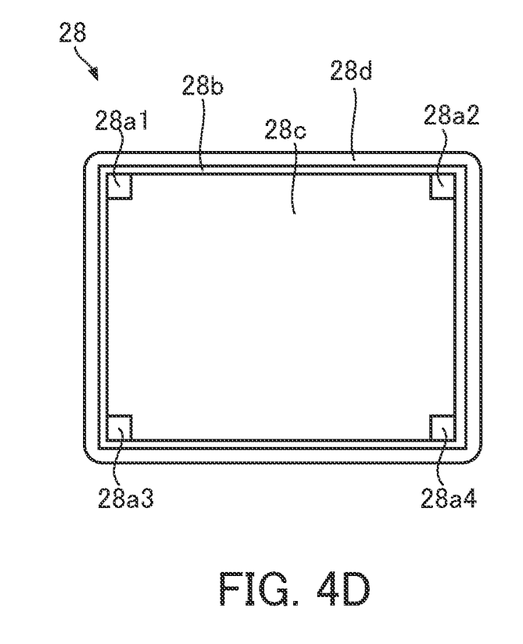
Figure 5:
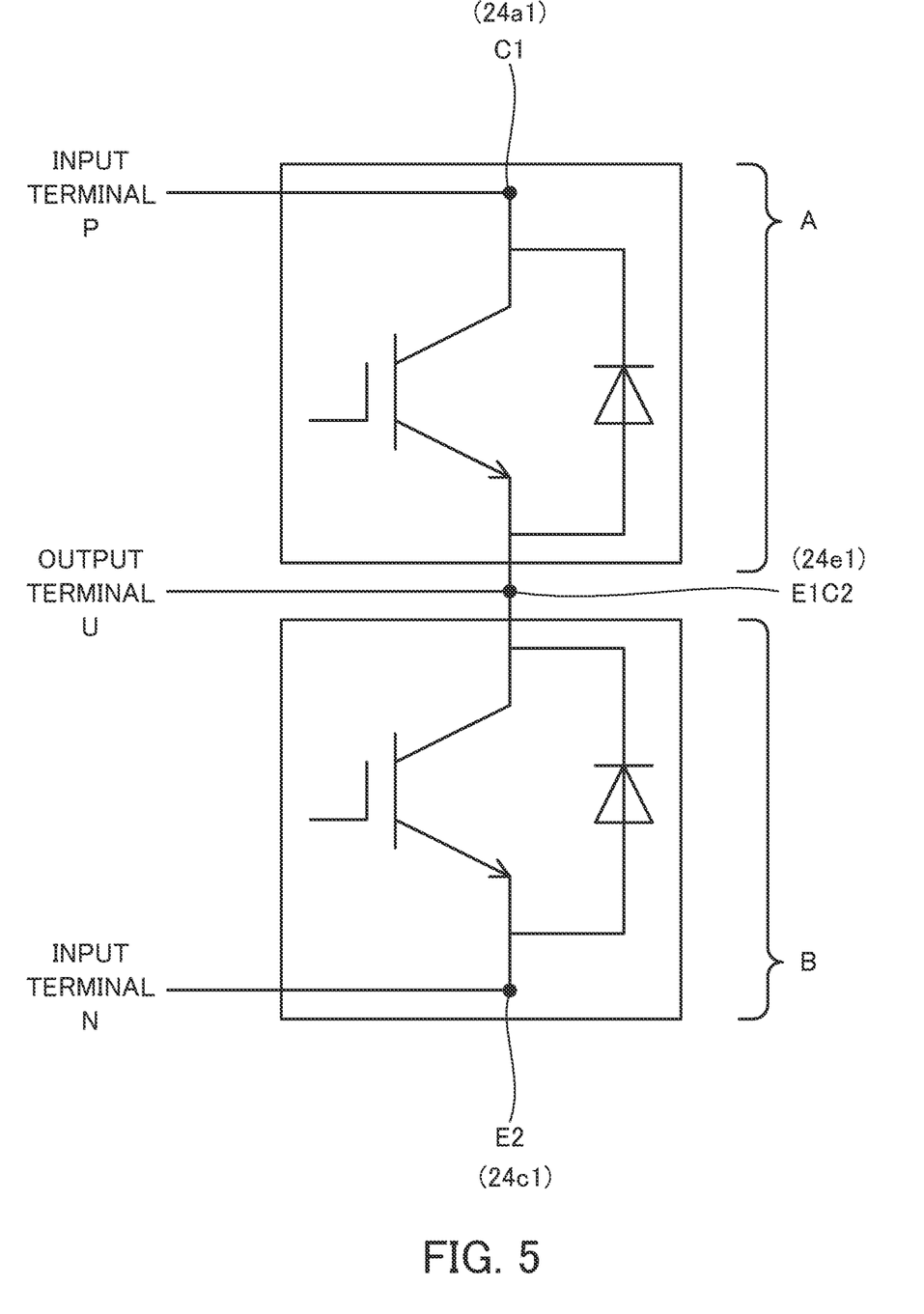
FIG. 5 illustrates an equivalent circuit realized by the semiconductor device according to the first embodiment.

Next, the semiconductor units 20 will be described with reference to FIGS. 2 to 5. FIG. 2 is a plan view of a semiconductor unit according to the first embodiment, and FIG. 3 is a sectional view of the semiconductor unit according to the first embodiment. FIG. 3 is a sectional view taken along a dashed-dotted line X-X in FIG. 2. The illustration of bonding wires is omitted in FIG. 3. FIGS. 4A to 4D are plan views of semiconductor chips included in the semiconductor unit according to the first embodiment. FIGS. 4A to 4D illustrate semiconductor chips 25 to 28. FIG. 5 illustrates an equivalent circuit realized by the semiconductor device according to the first embodiment.

This semiconductor unit 20 includes a first arm unit (upper arm unit) A and a second arm unit (lower arm unit) B, whereby the upper and lower arms are formed. As illustrated in FIGS. 2 and 3, the semiconductor unit 20 includes a ceramic circuit board 21 and the semiconductor chips 25 to 28 disposed on the front surface of the ceramic circuit board 21. In addition, the semiconductor unit 20 is manufactured by disposing the rear surface of the ceramic circuit board 21 on the heat dissipation board 11 via solder or silver solder (not illustrated) (see FIG. 1).

The semiconductor chips 25 to 28 are each made of silicon or silicon carbide as its main component. These semiconductor chips 25 to 28 each include a reverse conducting IGBT (RC-IGBT) as a switching element, in which an IGBT and a free wheeling diode (FWD) are formed on a single chip. Each RC-IGBT chip includes a circuit in which an IGBT and an FWD are connected in reverse-parallel to each other. The arrangement direction of the semiconductor chips 25 to 28 illustrated in FIG. 2 corresponds to the arrangement direction of the semiconductor chips 25 to 28 illustrated in FIGS. 4A to 4D. For example, the bottom right corner of the semiconductor chip 25 in FIG. 2 corresponds to a gate electrode 25a4 of the semiconductor chip 25 in FIG. 4A. In addition, the top left corner of the semiconductor chip 28 in FIG. 2 corresponds to a gate electrode 28a1 of the semiconductor chip 28 in FIG. 4D. Each of these semiconductor chips 25 to 28 has an input electrode (collector electrode) as a main electrode on its rear surface. In addition, the semiconductor chips 25 and 26 are disposed in a line. The semiconductor chips 27 and 28 are also disposed in a line. The semiconductor chips 25 and 26 may be misaligned in the horizontal direction in FIG. 2, instead of being disposed in a line. For example, a gate electrode 26a1 (or a gate electrode 26a2) of the semiconductor chip 26 may be disposed in a range between a gate electrode 25a3 (or the gate electrode 25a4) of the semiconductor chip 25 and the midpoint between the gate electrode 25a3 and the gate electrode 25a4. The semiconductor chips 27 and 28 may also be misaligned in the horizontal direction in FIG. 2.

The semiconductor chips 25 to 28 will be described in more detail. As illustrated in FIGS. 4A to 4D, the semiconductor chips 25 to 28 include their respective gate electrodes (control electrodes) 25a1 to 25a4, 26a1 to 26a4, 27a1 to 27a4, and 28a1 to 28a4. Each of these gate electrodes is formed at a corner portion on the front surface of the corresponding semiconductor chip having a rectangular shape in plan view. In addition, the semiconductor chips 25 to 28 include gate runners 25b, 26b, 27b, and 28b connecting to the gate electrodes 25a1 to 25a4, 26a1 to 26a4, 27a1 to 27a4, and 28a1 to 28a4, respectively. Each of these gate runners 25b, 26b, 27b, and 28b is formed along the sides of the corresponding front surface. In addition, the semiconductor chips 25 to 28 include voltage resistance structure portions 25d, 26d, 27d, and 28d, respectively, each of which is formed along the outer periphery of the corresponding front surface. The gate electrodes 25a1 to 25a4, 26a1 to 26a4, 27a1 to 27a4, and 28a1 to 28a4 each have an area large enough to bond a bonding wire 29a, 29b, 29e, or 29f thereto. In addition, the semiconductor chips 25 to 28 include emitter electrodes (output electrodes as main electrodes) 25c, 26c, 27c, and 28c, respectively, each of which is located inside the corner portions on the corresponding front surface. While not illustrated, a sense electrode is formed near each of the gate electrodes 25a1 to 25a4, 26a1 to 26a4, 27a1 to 27a4, and 28a1 to 28a4.

The ceramic circuit board 21 has a rectangular shape in plan view. The ceramic circuit board 21 includes an insulating plate 22 and a metal plate 23 formed on the rear surface of the insulating plate 22. In addition, the ceramic circuit board 21 includes circuit patterns 24a to 24e formed on the front surface of the insulating plate 22. The insulating plate 22 and the metal plate 23 each have a rectangular shape in plan view. In addition, corner portions of the insulating plate 22 and the metal plate 23 may be rounded or chamfered. The metal plate 23 is smaller than the insulating plate 22 in plan view and is formed on the inner side of the insulating plate 22.

The insulating plate 22 is made of ceramic material having good thermal conductivity as its main component. For example, the insulating plate 22 is made of ceramic material having a flexural strength of 450 MPa or more. For example, this ceramic material contains, as its main component, a composite material of aluminum oxide and zirconium oxide added thereto or contains silicon nitride as its main component. The insulating plate 22 has a thickness between 0.5 mm and 2.0 mm, inclusive.

The metal plate 23 is made of metal material having excellent thermal conductivity as its main component. Examples of the metal material include aluminum, iron, silver, copper, and an alloy containing at least one of these kinds. The metal plate 23 has a thickness between 0.1 mm and 2.0 mm, inclusive. The surface of the metal plate 23 may be plated to improve its corrosion resistance. Examples of the material used for this plating include nickel, a nickel-phosphorus alloy, and a nickel-boron alloy.

The circuit patterns 24a to 24e are each made of metal material having excellent electrical conductivity as its main component. Examples of the metal material include silver, copper, nickel, and an alloy containing at least one of these kinds. The circuit patterns 24a to 24e each have a thickness between 0.5 mm and 1.5 mm, inclusive. The surface of each of the circuit patterns 24a to 24e may be plated to improve its corrosion resistance. Examples of the material used for this plating include nickel, a nickel-phosphorus alloy, and a nickel-boron alloy. The circuit patterns 24a to 24e are obtained by forming a metal layer on the front surface of the insulating plate 22 and performing, for example, etching on this metal layer. Alternatively, the circuit patterns 24a to 24e may first be cut out from a metal layer and may next be press-bonded to the front surface of the insulating plate 22.

The circuit patterns 24a to 24e illustrated in FIGS. 2 and 3 are merely examples, and the number of circuit patterns 24a to 24e may be determined as needed. Further, the shape and size of each of the circuit patterns 24a to 24e may also be determined as needed. Plating may be performed so that plating material is formed on the surface of each of the circuit patterns 24a to 24e to improve the corrosion resistance of the circuit patterns 24a to 24e. Examples of the plating material include nickel, a nickel-phosphorus alloy, and a nickel-boron alloy.

For example, a direct copper bonding (DCB) substrate or an active metal brazed (AMB) substrate may be used as the ceramic circuit board 21 having the above structure. The ceramic circuit board 21 conducts the heat generated by the semiconductor chips 25 to 28 to the heat dissipation board 11 via the circuit patterns 24a and 24c, the insulating plate 22, and the metal plate 23.

The circuit pattern 24a constitutes the collector pattern of the first arm unit A. The circuit pattern 24a is bonded to collector electrodes formed on the rear surfaces of the semiconductor chips 25 and 26 via solder. The circuit pattern 24a has an approximately rectangular shape and has a portion protruding downward in FIG. 2, the portion including a contact area 24a1. The semiconductor chips 25 and 26 are disposed on the circuit pattern 24a via solder (not illustrated).

The circuit pattern 24b constitutes the control pattern of the first arm unit A. The circuit pattern 24b is connected to the gate electrode 26a3 of the semiconductor chip 26 via the bonding wire 29a. The circuit pattern 24b includes a connection area 24b1 connected to the bonding wire 29a. In FIG. 2, the circuit pattern 24b extends from the portion including the connection area 24b1 along one side (lower side in FIG. 2) of the insulating plate 22 perpendicularly to the arrangement direction of the semiconductor chips 25 and 26.

The circuit pattern 24c constitutes the emitter pattern of the first arm unit A and the collector pattern of the second arm unit B. The circuit pattern 24c includes a connection area 24c2 connected to bonding wires 29c and 29d connected to the emitter electrodes (output electrodes) 25c and 26c of the semiconductor chips 25 and 26. The connection area 24c2 extends in the same direction as the arrangement direction of the semiconductor chips 25 and 26. In addition, collector electrodes formed on the rear surfaces of the semiconductor chips 27 and 28 are bonded to the circuit pattern 24c via solder. The circuit pattern 24c has an approximately rectangular shape and has a portion protruding upward in FIG. 2, the portion including a contact area 24c1. The circuit pattern 24c is disposed side by side with the circuit pattern 24a.

The circuit pattern 24d constitutes the control pattern of the second arm unit B. The circuit pattern 24d is connected to the gate electrode 27a1 of the semiconductor chip 27 via the bonding wire 29e. The circuit pattern 24d includes a connection area 24d1 located on the opposite side with respect to the connection area 24b1 beyond the semiconductor chips 25 to 27. In FIG. 2, the circuit pattern 24d extends from the portion including the connection area 24d1 along one side (upper side in FIG. 2) of the insulating plate 22 perpendicularly to the arrangement direction of the semiconductor chips 27 and 28.

The circuit pattern 24e constitutes the emitter pattern of the second arm unit B. The circuit pattern 24e includes a connection area 24e2 connected to bonding wires 29g and 29h connected to the emitter electrodes 27c and 28c of the semiconductor chips 27 and 28. The connection area 24e2 is disposed side by side with the semiconductor chips 27 and 28. Thus, the circuit pattern 24e includes a portion located on the opposite side with respect to the circuit pattern 24a beyond the circuit pattern 24c. The circuit pattern 24e has an L shape, which is formed by two orthogonal portions, between two orthogonal sides of the circuit pattern 24c and two sides of the insulating plate 22. In addition, the circuit pattern 24e includes a contact area 24e1 at a portion of the insulating plate 22 on the lower side in FIG. 2.

The bonding wires 29a to 29h are each made of metal material having excellent electrical conductivity as its main component. Examples of the metal material includes gold, silver, copper, aluminum, and an alloy containing at least one of these kinds. In addition, the bonding wires 29a, 29b, 29e, and 29f each have a diameter, for example, between 120 μm and 130 μm, inclusive, and the bonding wires 29c, 29d, 29g, and 29h each have a diameter between 390 μm and 410 μm, inclusive.

The bonding wire 29a bonds and electrically connects the gate electrode 26a3 of the semiconductor chip 26 and the connection area 24b1 of the circuit pattern 24b. The bonding wire 29b connects the gate electrode 25a3 or 25a4 disposed near the semiconductor chip 26 and the gate electrode 26a1 or 26a2 disposed near the semiconductor chip 25. Specifically, at least the gate electrodes 25a3 and 26a1 or the gate electrodes 25a4 and 26a2 are connected to each other. Alternatively, the gate electrodes 25a3 and 26a2 or the gate electrodes 25a4 and 26a1 may be connected to each other. In FIG. 2, among the gate electrodes 25a3 and 25a4 disposed near the semiconductor chip 26 and the gate electrodes 26a1 and 26a2 disposed near the semiconductor chip 25, the bonding wire 29b connects the gate electrode 25a4 and the gate electrode 26a2 located mutually closest to each other.

The bonding wires 29c and 29d extend perpendicularly to the arrangement direction of the semiconductor chips 25 and 26 and electrically connect the emitter electrodes 25c and 26c of the semiconductor chips 25 and 26 and the connection area 24c2 of the circuit pattern 24c by continually bonding a plurality of portions on the emitter electrodes 25c and 26c of the semiconductor chips 25 and 26 and the connection area 24c2 of the circuit pattern 24c.

The bonding wire 29e electrically connects the gate electrode 27a1 of the semiconductor chip 27 and the connection area 24d1 of the circuit pattern 24d. The bonding wire 29f connects the gate electrode 27a3 or 27a4 disposed near the semiconductor chip 28 and the gate electrode 28a1 or 28a2 disposed near the semiconductor chip 27. Specifically, at least the gate electrodes 27a3 and 28a1 or the gate electrodes 27a4 and 28a2 are connected to each other. Alternatively, the gate electrodes 27a3 and 28a2 or the gate electrodes 27a4 and 28a1 may be connected to each other. In FIG. 2, among the gate electrodes 27a3 and 27a4 disposed near the semiconductor chip 28 and the gate electrodes 28a1 and 28a2 disposed near the semiconductor chip 27, the bonding wire 29f connects the gate electrode 27a3 and the gate electrode 28a1 located mutually closest to each other.

The bonding wires 29g and 29h extend perpendicularly to the arrangement direction of the semiconductor chips 27 and 28 and electrically connect the emitter electrodes 27c and 28c of the semiconductor chips 27 and 28 and the connection area 24e2 of the circuit pattern 24e by continually bonding a plurality of portions on the emitter electrodes 27c and 28c of the semiconductor chips 27 and 28 and the connection area 24e2 of the circuit pattern 24e.

The semiconductor chips 25 to 28 and the circuit patterns 24a to 24e are connected via the bonding wires 29a to 29h as described above, to form an inverter circuit illustrated in FIG. 5. The semiconductor chips 25 and 26, the circuit patterns 24a and 24b, and the bonding wires 29a and 29b constitute the first arm unit (upper arm unit) A of the semiconductor unit 20. In addition, the semiconductor chips 27 and 28, the circuit patterns 24c and 24d, and the bonding wires 29e and 29f constitute the second arm unit (lower arm unit) B of the semiconductor unit 20. The semiconductor unit 20 includes a terminal C1 (corresponding to the contact area 24a1), a terminal E2 (corresponding to the contact area 24c1), and a terminal E1C2 (corresponding to the contact area 24e1).

A high potential terminal of an external power supply is connected to the terminal C1 corresponding to an input terminal P, and a low potential terminal of the external power supply is connected to the terminal E2 corresponding to an input terminal N. In addition, load (not illustrated) is connected to the terminal E1C2 corresponding to an output terminal U of the semiconductor unit 20. The semiconductor unit 20 consequently functions as an inverter.

The plurality of semiconductor units 20, each of which has the above structure, may be disposed on the heat dissipation board 11, a lead frame (not illustrated) may be bonded to each of the contact areas 24a1, 24c1, and 24e1, and the semiconductor chips 25 to 28 and the bonding wires 29a to 29h on the ceramic circuit board 21 may be sealed with sealing material. The sealing material includes thermosetting resin and filling material included therein. Examples of the thermosetting resin include epoxy resin, phenolic resin, and maleimide resin. The filling material is a filler, examples of which include silicon oxide, aluminum oxide, boron nitride, and aluminum nitride.

Figure 6:
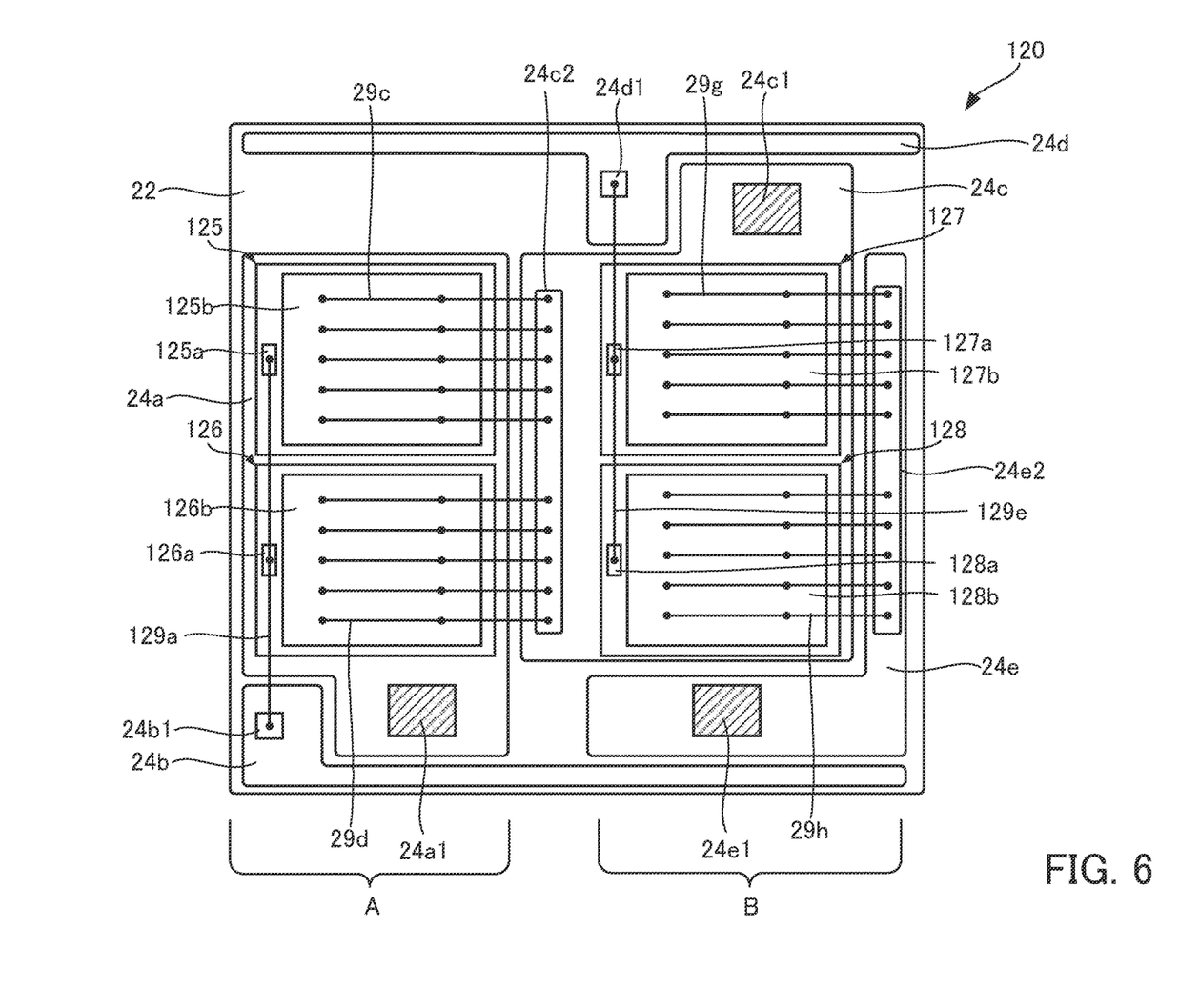
FIG. 6 is a plan view of a semiconductor unit according to a reference example.

Next, in comparison with the semiconductor units 20, a semiconductor unit according to a reference example will be described with reference to FIG. 6. FIG. 6 is a plan view of a semiconductor unit according to a reference example. A semiconductor unit 120 illustrated in FIG. 6 includes the same components as those of the individual semiconductor unit 20. Thus, these components will be denoted by the same reference characters as those in the above drawings, and description of these components will be omitted. The semiconductor unit 120 includes semiconductor chips 125 to 128, in place of the semiconductor chips 25 to 28 of the semiconductor unit 20. The semiconductor chips 125 to 128 are each an RC-IGBT, as is the case with the semiconductor chips 25 to 28. The semiconductor chip 125 includes a gate electrode 125a formed in a center portion of an end portion on its front surface and an emitter electrode 125b formed in a center portion on its front surface. Likewise, the semiconductor chips 126 to 128 include gate electrodes 126a to 128a and emitter electrodes 126b to 128b, respectively, in the same manner as the gate electrode 125a and emitter electrode 125b of the semiconductor chip 125.

The semiconductor chips 125 and 126 are disposed in a line so that the gate electrodes 125a and 126a are disposed on the opposite side with respect to the semiconductor chips 127 and 128. A bonding wire 129a connects a connection area 24b1 of a circuit pattern 24b and the gate electrodes 126a and 125a of the semiconductor chips 126 and 125. The semiconductor chips 127 and 128 are disposed in a line so that the gate electrodes 127a and 128a are disposed near the semiconductor chips 125 and 126. A bonding wire 129e connects a connection area 24d1 of a circuit pattern 24d and the gate electrodes 127a and 128a of the semiconductor chips 127 and 128. Each of the bonding wires 129*a* and 129*e* also has a diameter between 120 μm and 130 μm, inclusive.

In the case of this semiconductor unit 120, the bonding wire 129*a* connects the connection area 24*b*1 of the circuit pattern 24*b*, the gate electrode 126*a*, and the gate electrode 125*a*. In addition, the bonding wire 129*e* connects the connection area 24*d*1 of the circuit pattern 24*d*, the gate electrode 127*a*, and the gate electrode 128*a*. Each of these bonding wires 129*a* and 129*e* forms an arch with a predetermined curvature on the front surface of the corresponding one of the circuit patterns 24*a* and 24*c*. When this semiconductor unit 120 is handled or when a heat dissipation board 11 on which a plurality of semiconductor units 120 are formed is handled, the bonding wires 129*a* and 129*e* could come into contact with an object and could consequently be tilted. In particular, if the semiconductor unit 120 is located at an endmost portion of the heat dissipation board 11, since the corresponding bonding wire 129*a* is located at the endmost portion, the bonding wire 129*a* easily comes into contact with an object and is easily tilted. If a semiconductor device is manufactured with the bonding wire 129*a* being tilted in the direction of bonding wires 29*c* and 29*d*, the semiconductor device exhibits an electrical failure. The bonding wire 129*e* could also be tilted in the direction of bonding wires 29*g* and 29*h* or the bonding wires 29*c* and 29*d*.

In contrast, in the individual semiconductor unit 20 of the semiconductor device 10, the semiconductor chips 25 to 28 include the gate electrodes 25*a*1 to 25*a*4, 26*a*1 to 26*a*4, 27*a*1 to 27*a*4, and 28*a*1 to 28*a*4 at their respective corner portions on their respective front surfaces. In addition, the semiconductor unit 20 includes the circuit pattern 24*b*, which is disposed near one of the sides of the semiconductor chip 26, excepting the side near which the semiconductor chip 25 is disposed, and the circuit pattern 24*d*, which is disposed near one of the sides of the semiconductor chip 27, excepting the side near which the semiconductor chip 28 is disposed. The bonding wire 29*b* connects the gate electrode 25*a*4 disposed near the semiconductor chip 26 and the gate electrode 26*a*2 disposed near the semiconductor chip 25. The bonding wire 29*f* connects the gate electrode 28*a*1 disposed near the semiconductor chip 27 and the gate electrode 27*a*3 disposed near the semiconductor chip 28. The bonding wire 29*a* connects the gate electrode 26*a*3 disposed near the circuit pattern 24*b* and the circuit pattern 24*b*, and the bonding wire 29*e* connects the gate electrode 27*a*1 disposed near the circuit pattern 24*d* and the circuit pattern 24*d*.

In the case of the semiconductor unit 20 of the semiconductor device 10, a gate voltage is applied via the bonding wires 29*a* and 29*b* and the bonding wires 29*e* and 29*f*. That is, the length between the connection portions of any one of the bonding wires 29*a* and 29*b* and the bonding wires 29*e* and 29*f* is shorter than the length between the connection portions of any one of the bonding wires 129*a* and 129*e* according to the reference example, and thus, the arches made by the bonding wires 29*a*, 29*b*, 29*e*, and 29*f* are lower than those made by the bonding wires 129*a* and 129*e*. Thus, even if the bonding wires 29*a* and 29*b* and the bonding wires 29*e* and 29*f* come into contact with an external object, these bonding wires 29*a*, 29*b*, 29*e*, and 29*f* are not easily tilted. In addition, the bonding wire 29*b* connects the gate electrodes 25*a*4 and 26*a*2 disposed near the semiconductor chips 27 and 28, and the bonding wire 29*f* connects the gate electrodes 27*a*3 and 28*a*1 disposed near the semiconductor chips 25 and 26. That is, the bonding wires 29*b* and 29*f* extend on the inner side of the semiconductor unit 20. For this reason, the bonding wires 29*b* and 29*f* do not easily come into contact with an external object, and the bonding wires 29*b* and 29*f* are prevented from being tilted. Thus, the semiconductor device 10 is prevented from malfunctioning due to an electrical failure, whereby deterioration of the reliability of the semiconductor device 10 is prevented.

In the case of the semiconductor device 10, the bonding wire 29*a* connects the circuit pattern 24*b* and the gate electrode 26*a*3 disposed near the circuit pattern 24*b*. However, alternatively, depending on the shapes or the design specifications of the circuit patterns 24*a* and 24*b*, the bonding wire 29*a* may connect the circuit pattern 24*b* and the gate electrode 26*a*4 disposed near the circuit pattern 24*b*. Still alternatively, two bonding wires 29*a* may be used to connect the circuit pattern 24*b* and the gate electrodes 26*a*3 and 26*a*4. The same applies to the connection of the circuit pattern 24*d* and at least one of the gate electrodes 27*a*1 and 27*a*2 disposed near the circuit pattern 24*d* by using at least one bonding wire 29*e*.

Second Embodiment

Figure 7:
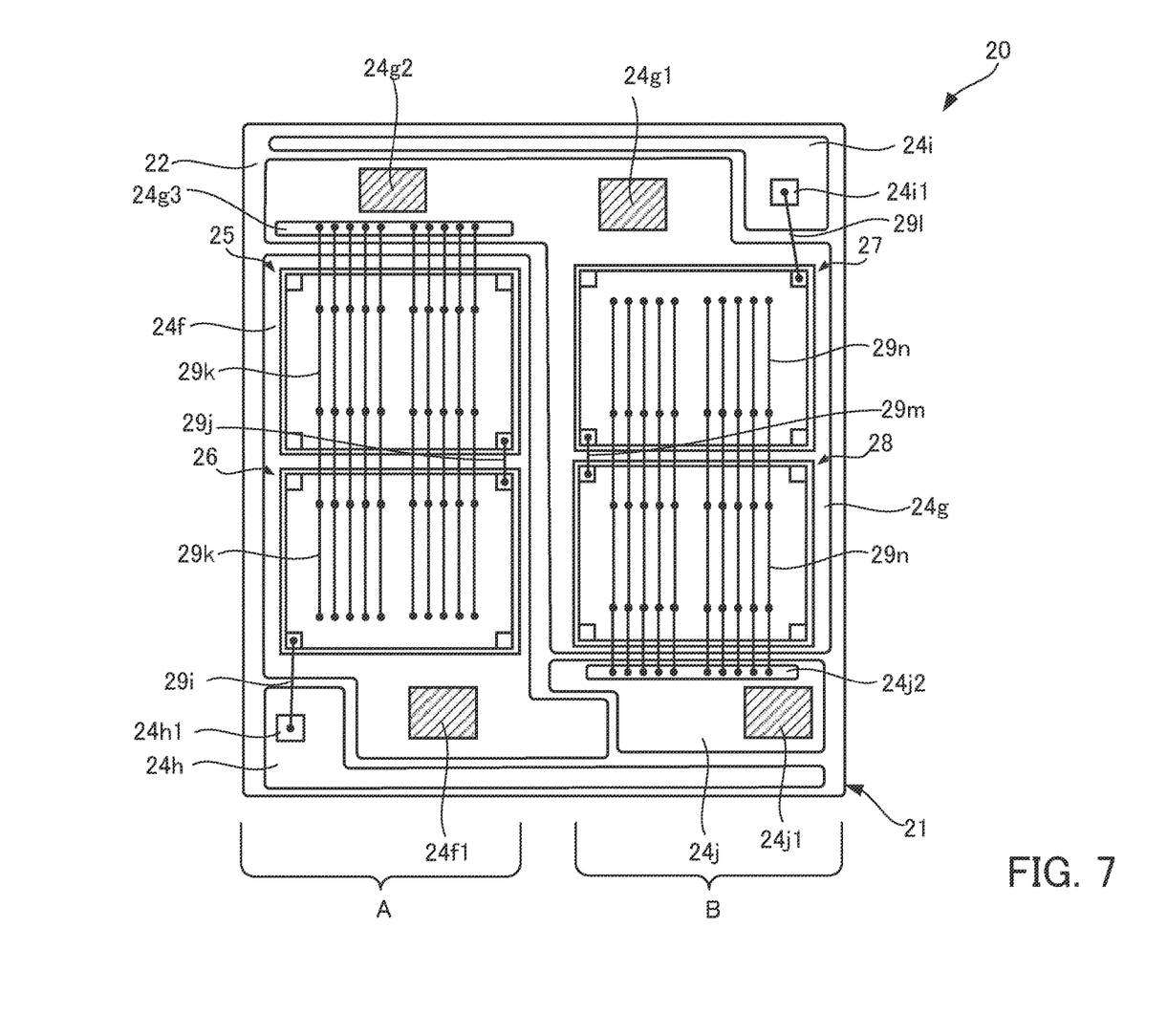
FIG. 7 is a plan view of a semiconductor unit according to a second embodiment.

A second embodiment will be described with reference to FIG. 7. A semiconductor unit 20 according to the second embodiment includes circuit patterns different from those according to the first embodiment. FIG. 7 is a plan view of a semiconductor unit according to the second embodiment. A semiconductor device according to the second embodiment includes the semiconductor unit 20 illustrated in FIG. 7 in plurality on the heat dissipation board 11 illustrated in FIG. 1, in place of the semiconductor units 20 according to the first embodiment. In addition, semiconductor chips 25 to 28 included in the individual semiconductor unit 20 according to the second embodiment are the same as those according to the first embodiment. Thus, in FIG. 7, reference characters of components such as gate electrodes included in the semiconductor chips 25 to 28 are omitted. The same reference characters illustrated in FIGS. 2 and 4 may be used for these semiconductor chips 25 to 28.

The semiconductor unit 20 includes a first arm unit A and a second arm unit B, whereby the upper and lower arms are formed. The semiconductor unit 20 includes a ceramic circuit board 21 and the semiconductor chips 25 to 28 disposed on the front surface of the ceramic circuit board 21. The semiconductor chips 25 to 28 are the same as those according to the first embodiment. The ceramic circuit board 21 of the semiconductor unit 20 is disposed on the heat dissipation board 11 via solder or silver solder (not illustrated) (see FIG. 1).

The ceramic circuit board 21 has a rectangular shape in plan view. The ceramic circuit board 21 includes an insulating plate 22 and a metal plate 23 formed on the rear surface of the insulating plate 22 (not illustrated in FIG. 7). In addition, the ceramic circuit board 21 includes circuit patterns 24*f* to 24*j* formed on the front surface of the insulating plate 22. The insulating plate 22 and the metal plate 23 are the same as those according to the first embodiment. The circuit patterns 24*f* to 24*j* are made of the same material and have the same thickness as those of the circuit patterns 24*a* to 24*e* according to the first embodiment. In addition, the circuit patterns 24*f* to 24*j* are formed on the insulating plate 22 in the same way as the circuit patterns 24*a* to 24*e* according to the first embodiment.

For example, a DCB substrate or an AMB substrate may be used as the ceramic circuit board 21 having the above structure. The ceramic circuit board 21 conducts the heat generated by the semiconductor chips 25 to 28 to the heat dissipation board 11 via the circuit patterns 24f and 24g, the insulating plate 22, and the metal plate 23.

The circuit pattern 24f constitutes the collector pattern of the first arm unit A. The circuit pattern 24f is bonded to collector electrodes formed on the rear surface of the semiconductor chips 25 and 26 via solder. The circuit pattern 24f has an approximately rectangular shape and has a portion protruding in the bottom right direction in FIG. 7, the portion including a contact area 24f1. The semiconductor chips 25 and 26 are disposed on the circuit pattern 24f via solder (not illustrated) or the like.

The circuit pattern 24h constitutes the control pattern of the first arm unit A. The circuit pattern 24h is electrically connected to a gate electrode 26a3 of the semiconductor chip 26 via a bonding wire 29i. The circuit pattern 24h includes a connection area 24h1 connected to the bonding wire 29i. In FIG. 7, the circuit pattern 24h extends from the portion including the connection area 24h1 along one side (lower side in FIG. 7) of the insulating plate 22 perpendicularly to the arrangement direction of the semiconductor chips 25 and 26.

The circuit pattern 24g constitutes the emitter pattern of the first arm unit A and the collector pattern of the second arm unit B. The circuit pattern 24g includes an area (wiring area) extending above the circuit pattern 24f in FIG. 7, the area including a connection area 24g3 connected to emitter electrodes (output electrodes) 25c and 26c of the semiconductor chips 25 and 26 via bonding wires 29k. In addition, collector electrodes formed on the rear surfaces of the semiconductor chips 27 and 28 are bonded on the circuit pattern 24g via solder. The circuit pattern 24g has an approximately L shape, and contact areas 24g1 and 24g2 are included in the above wiring area. The circuit pattern 24g is disposed along two sides of the circuit pattern 24f.

The circuit pattern 24i constitutes the control pattern of the second arm unit B. The circuit pattern 24i is connected to a gate electrode 27a2 of the semiconductor chip 27 via a bonding wire 29l. The circuit pattern 24i includes a connection area 24i1 located in point symmetry with respect to the connection area 24h1. In FIG. 7, the circuit pattern 24i has point symmetry with respect to the circuit pattern 24h and extends along one side (upper side in FIG. 7) of the insulating plate 22 perpendicularly to the arrangement direction of the semiconductor chips 27 and 28.

The circuit pattern 24j constitutes the emitter pattern of the second arm unit B. The circuit pattern 24j includes a connection area 24j2 connected to emitter electrodes 27c and 28c of the semiconductor chips 27 and 28 via bonding wires 29n. The circuit pattern 24j is disposed on the opposite side with respect to the circuit pattern 24i beyond the circuit pattern 24g. The circuit pattern 24j includes a contact area 24j1.

The bonding wires 29i to 29n are made of the same material as that of the bonding wires 29a to 29h according to the first embodiment. In addition, the bonding wires 29i, 29j, 29l, and 29m each have the same diameter as that of the bonding wires 29a, 29b, 29e, and 29f. The bonding wires 29k and 29n each have the same diameter as that of the bonding wires 29c, 29d, 29g, and 29h.

The bonding wire 29i electrically connects the gate electrode 26a3 of the semiconductor chip 26 and the connection area 24h1 of the circuit pattern 24h by bonding. The bonding wire 29j connects a gate electrode 25a3 or 25a4 disposed near the semiconductor chip 26 and a gate electrode 26a1 or 26a2 disposed near the semiconductor chip 25. Specifically, at least the gate electrodes 25a3 and 26a1 or the gate electrodes 25a4 and 26a2 are connected to each other. In FIG. 7, among the gate electrodes 25a3 and 25a4 disposed near the semiconductor chip 26 and the gate electrodes 26a1 and 26a2 disposed near the semiconductor chip 25, the bonding wire 29j connects the gate electrode 25a4 and the gate electrode 26a2 located mutually closest to each other.

The bonding wires 29k extend in parallel to the arrangement direction of the semiconductor chips 25 and 26 and electrically connect the emitter electrodes 25c and 26c of the semiconductor chips 25 and 26 and the connection area 24g3 of the circuit pattern 24g by continually bonding a plurality of portions on the emitter electrodes 25c and 26c of the semiconductor chips 25 and 26 and the connection area 24g3 of the circuit pattern 24g.

The bonding wire 29l electrically connects the gate electrode 27a2 of the semiconductor chip 27 and the connection area 24i1 of the circuit pattern 24i by bonding. The bonding wire 29m connects a gate electrode 27a3 or 27a4 disposed near the semiconductor chip 28 and a gate electrode 28a1 or 28a2 disposed near the semiconductor chip 27. Specifically, at least the gate electrodes 27a3 and 28a1 or the gate electrodes 27a4 and 28a2 are connected to each other. In FIG. 7, among the gate electrodes 27a3 and 27a4 disposed near the semiconductor chip 28 and the gate electrodes 28a1 and 28a2 disposed near the semiconductor chip 27, the bonding wire 29m connects the gate electrode 27a3 and the gate electrode 28a1 located mutually closest to each other.

The bonding wires 29n extend in parallel to the arrangement direction of the semiconductor chips 27 and 28 and electrically connect the emitter electrodes 27c and 28c of the semiconductor chips 27 and 28 and the connection area 24j2 of the circuit pattern 24j by continually bonding a plurality of portions on the emitter electrodes 27c and 28c of the semiconductor chips 27 and 28 and the connection area 24j2 of the circuit pattern 24j.

The semiconductor chips 25 to 28 and the circuit patterns 24f to 24j are connected via the bonding wires 29i to 29n as described above, to form an inverter circuit illustrated in FIG. 5, as in the first embodiment. The semiconductor chips 25 and 26, the circuit patterns 24f and 24h, and the bonding wires 29i and 29j constitute the first arm unit A of the semiconductor unit 20. In addition, the semiconductor chips 27 and 28, the circuit patterns 24i, 24g, and 24j, and the bonding wires 29l and 29m constitute the second arm unit B of the semiconductor unit 20. In addition, the semiconductor unit 20 includes a terminal C1 (corresponding to the contact area 24f1), a terminal E2 (corresponding to the contact areas 24g1 and 24g2), and a terminal E1C2 (corresponding to the contact area 24j1).

A high potential terminal of an external power supply is connected to the terminal C1 corresponding to an input terminal P, and a low potential terminal of the external power supply is connected to the terminal E2 corresponding to an input terminal N. In addition, load (not illustrated) is connected to the terminal E1C2 corresponding to an output terminal U of the semiconductor unit 20. The semiconductor unit 20 consequently functions as an inverter.

The semiconductor unit 20 having the above structure may be disposed on the heat dissipation board 11, a lead frame (not illustrated) may be bonded to each of the contact areas 24f1, 24g1, 24g2, and 24j1, and the semiconductor chips 25 to 28 and the bonding wires 29i to 29n on the ceramic circuit board 21 may be sealed with sealing material, as in the first embodiment.

In the case of the semiconductor unit 20 included in the semiconductor device according to the second embodiment, the semiconductor chips 25 to 28 also include their respective gate electrodes 25a1 to 25a4, 26a1 to 26a4, 27a1 to 27a4, and 28a1 to 28a4 at their respective corner portions on their respective front surfaces. In addition, the semiconductor unit 20 includes the circuit pattern 24h, which is disposed near one of the sides of the semiconductor chip 26, excepting the side near which the semiconductor chip 25 is disposed, and the circuit pattern 24i, which is disposed near one of the sides of the semiconductor chip 27, excepting the side near which the semiconductor chip 28 is disposed. The bonding wire 29j connects the gate electrode 25a4 disposed near the semiconductor chip 26 and the gate electrode 26a2 disposed near the semiconductor chip 25. The bonding wire 29m connects the gate electrode 28a1 disposed near the semiconductor chip 27 and the gate electrode 27a3 disposed near the semiconductor chip 28. The bonding wire 29i connects the gate electrode 26a3 disposed near the circuit pattern 24h and the circuit pattern 24h, and the bonding wire 29l connects the gate electrode 27a2 disposed near the circuit pattern 24i and the circuit pattern 24i.

In the case of the semiconductor unit 20 of the semiconductor device, a gate voltage is applied via the plurality of bonding wires 29i and 29j and bonding wires 29l and 29m. That is, the length between the connection portions of any one of the bonding wires 29i, 29j, 29l, and 29m is short, and arches made by these bonding wires 29i, 29j, 29l, and 29m are low. Thus, even if the bonding wires 29i, 29j, 29l, and 29m come into contact with an external object, these bonding wires 29i, 29j, 29l, and 29m are not easily tilted. In addition, the bonding wire 29j connects the gate electrodes 25a4 and 26a2 disposed near the semiconductor chips 27 and 28, and the bonding wire 29m connects the gate electrodes 27a3 and 28a1 disposed near the semiconductor chips 25 and 26. That is, the bonding wires 29j and 29m extend on the inner side of the semiconductor unit 20. For this reason, the bonding wires 29j and 29m do not easily come into contact with an external object, and the bonding wires 29j and 29m are prevented from being tilted. Thus, the semiconductor device is prevented from malfunctioning due to an electrical failure, whereby deterioration of the reliability of the semiconductor device is prevented.

In the second embodiment, too, the bonding wire 29i may connect the circuit pattern 24h and the gate electrode 26a4 disposed near the circuit pattern 24h. Still alternatively, two bonding wires 29i may be used to connect the circuit pattern 24h and the gate electrodes 26a3 and 26a4. The same applies to the connection of the circuit pattern 24i and at least one of the gate electrodes 27a1 and 27a2 disposed near the circuit pattern 24g by using at least one bonding wire 29l.

In addition, in the semiconductor unit 20 according to the second embodiment, the circuit pattern 24j constituting an emitter pattern does not extend on a lateral side of the circuit pattern 24g, unlike the semiconductor unit 20 according to the first embodiment. In addition, in the semiconductor unit 20 according to the second embodiment, the bonding wires 29k extend in parallel to the bonding wire 29j and the arrangement direction of the semiconductor chips 25 and 26. The bonding wires 29n extend in parallel to the bonding wire 29m and the arrangement direction of the semiconductor chips 27 and 28. Thus, the semiconductor unit 20 may have a narrower width, whereby downsizing of the semiconductor device including these semiconductor units 20 is achieved.

Third Embodiment

Figure 8:
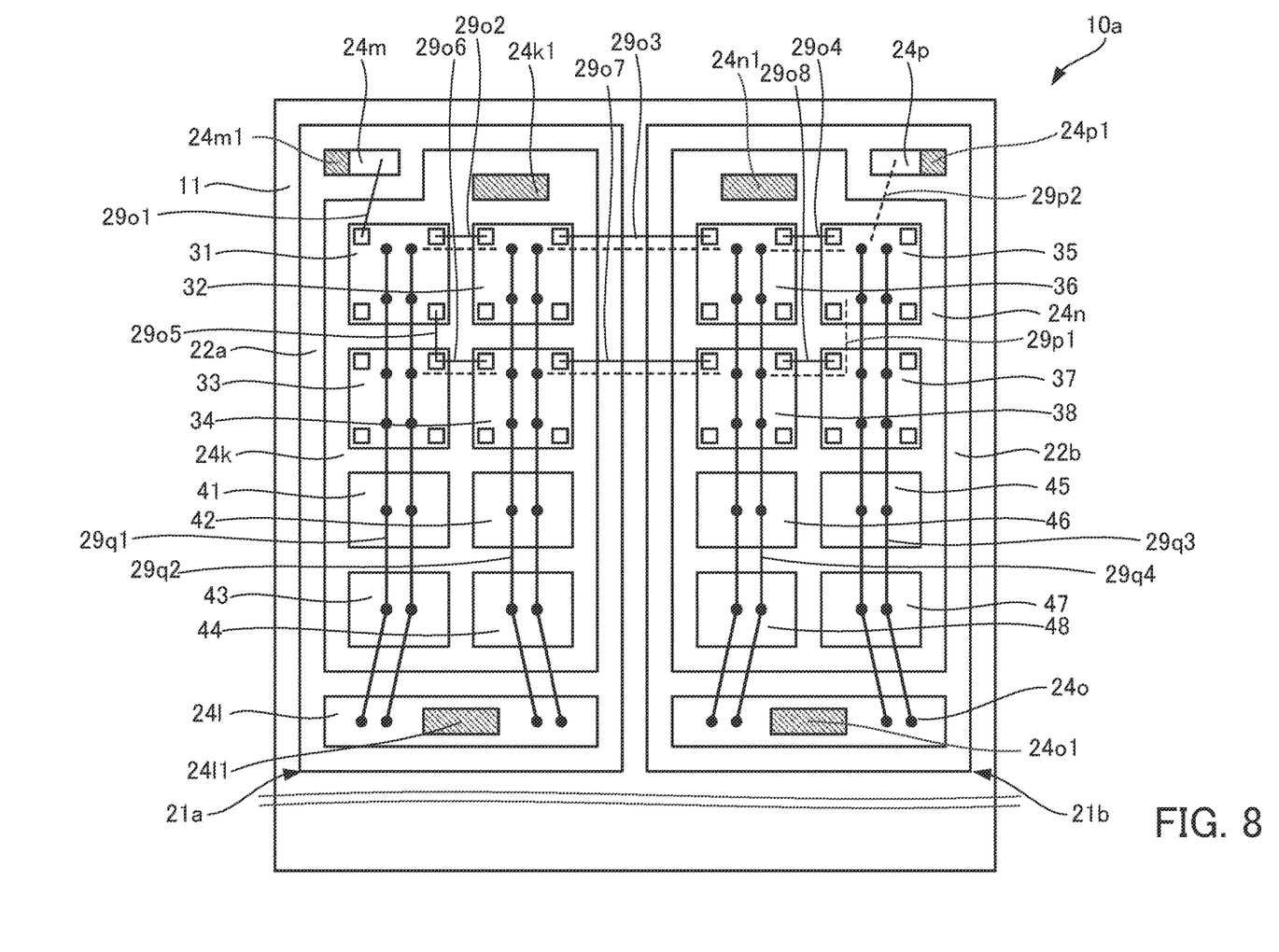
FIG. 8 is a plan view of a semiconductor device according to a third embodiment.

A third embodiment will be described with reference to FIG. 8. This third embodiment differs from the first and second embodiments in that gate electrodes of semiconductor chips on different circuit patterns are connected to each other via bonding wires. FIG. 8 is a plan view of a semiconductor device according to the third embodiment.

A semiconductor device 10a includes a heat dissipation board 11, ceramic circuit boards 21a and 21b disposed on the heat dissipation board 11, semiconductor chips 31 to 34 and 41 to 44 disposed on the ceramic circuit board 21a, and semiconductor chips 35 to 38 and 45 to 48 disposed on the ceramic circuit board 21b.

The ceramic circuit boards 21a and 21b each have a rectangular shape in plan view. The ceramic circuit board 21a includes an insulating plate 22a and a metal plate (not illustrated) formed on the rear surface of the insulating plate 22a. The ceramic circuit board 21b includes an insulating plate 22b and a metal plate (not illustrated) formed on the rear surface of the insulating plate 22b. In addition, the ceramic circuit board 21a includes circuit patterns 24k to 24m formed on the front surface of the insulating plate 22a, and the ceramic circuit board 21b includes circuit patterns 24n to 24p formed on the front surface of the insulating plate 22b. The insulating plates 22a and 22b and the metal plates are the same as the insulating plate 22 and the metal plate 23 according to the first embodiment. The circuit patterns 24k to 24m and 24n to 24p are made of the same material and have the same thickness as those of the circuit patterns 24a to 24e according to the first embodiment. In addition, the circuit patterns 24k to 24m and 24n to 24p are formed on the insulating plates 22a and 22b in the same way as the circuit patterns 24a to 24e according to the first embodiment.

For example, a DCB substrate or an AMB substrate may be used as each of the ceramic circuit boards 21a and 21b having the above structure. The ceramic circuit boards 21a and 21b conducts the heat generated by the semiconductor chips 31 to 34 and 41 to 44 and the semiconductor chips 35 to 38 and 45 to 48 to the heat dissipation board 11 via the circuit patterns 24k and 24n, the insulating plates 22a and 22b, and the metal plates.

The circuit patterns 24k and 24n each constitute a collector pattern. The collector electrodes formed on the rear surfaces of the semiconductor chips 31 to 34 and 35 to 38 are bonded to the circuit patterns 24k and 24n via solder. The cathode electrodes formed on the rear surfaces of the semiconductor chips 41 to 44 and 45 to 48 are bonded to the circuit patterns 24k and 24n via solder. In addition, the circuit patterns 24k and 24n include contact areas 24k1 and 24n1, respectively, to which main electrode terminals are connected, in an upper portion in FIG. 8.

The circuit patterns 24m and 24p each constitute a control pattern. The circuit pattern 24m is connected to a bonding wire connected to a gate electrode of the semiconductor chip 31. The circuit pattern 24m includes a contact area 24m1 connected to a control terminal. The circuit pattern 24p is connected to a bonding wire connected to a sense electrode of the semiconductor chip 35. The circuit pattern 24p includes a contact area 24p1 connected to a sense terminal.

The circuit patterns 24l and 24o each constitute an emitter pattern. The circuit pattern 24l is connected to bonding wires 29q1 and 29q2 connected to the input electrodes (anode electrodes) of the semiconductor chips 43 and 44. The circuit pattern 24o is connected to bonding wires 29q3 and 29q4 connected to the input electrodes (anode electrodes) of the semiconductor chips 47 and 48. The circuit pattern 24l includes a contact area 24l1 connected to a main electrode terminal, and the circuit pattern 24o includes a contact area 24o1 connected to a main electrode terminal.

The semiconductor chips 31 to 38 are switching elements, each of which is made of silicon or silicon carbide as its main component. These switching elements are, for example, IGBTs or power MOSFETs. If the semiconductor chips 31 to 38 are IGBTs, the individual semiconductor chip includes a collector electrode as a main electrode on its rear surface and includes a gate electrode and an emitter electrode as a main electrode on its front surface. If the semiconductor chips 31 to 38 are power MOSFETs, the individual semiconductor chip includes a drain electrode as a main electrode on its rear surface and includes a gate electrode and a source electrode as a main electrode on its front surface. In addition, as in the first embodiment, the semiconductor chips 31 to 38 include gate electrodes (their reference characters are not illustrated), each of which is formed on a corner portion on the front surface of the corresponding semiconductor chip having a rectangular shape in plan view. In addition, the semiconductor chips 31 to 38 include gate runners (not illustrated) connecting to their respective gate electrodes. Each of these gate runners is formed along the sides of the corresponding front surface. In addition, the semiconductor chips 31 to 38 include voltage resistance structure portions (not illustrated), each of which is formed along the outer periphery of the corresponding front surface. In addition, the semiconductor chips 31 to 38 include emitter electrodes or drain electrodes (not illustrated), each of which is located inside the corner portions on the front surface of the corresponding semiconductor chip. While not illustrated, a sense electrode is formed near each of the gate electrodes. Each of these semiconductor chips 31 to 38 is bonded to the corresponding one of the circuit patterns 24k and 24n via solder, for example.

The semiconductor chips 41 to 48 are each a diode element made of silicon or silicon carbide as its main component. Examples of the diode elements include FWDs such as Schottky barrier diodes (SBDs) or P-intrinsic-N (PiN) diodes. Each of these semiconductor chips 41 to 48 includes a cathode electrode as a main electrode on its rear surface and an anode electrode as a main electrode on its front surface. The semiconductor chips 41 to 44 are bonded to the circuit pattern 24k, for example, via solder, and the semiconductor chips 45 to 48 are bonded to the circuit pattern 24n, for example, via solder.

Bonding wires 29o1 to 29o8, 29p1, 29p2, and the bonding wires 29q1 to 29q4 are made of the same material as that of the bonding wires 29a to 29h according to the first embodiment. In FIG. 8, there are some bonding wires that are intentionally illustrated as dashed lines. In practice, these bonding wires are made of the same material and have the same diameter as those of the bonding wires 29o2 to 29o4 and 2906 to 29o8. Among the bonding wires illustrated as dashed lines, only the bonding wires 29p1 and 29p2 are denoted by reference characters.

The bonding wire 29o1 electrically connects the gate electrode (top left corner) of the semiconductor chip 31 and the circuit pattern 24m. The bonding wire 29o2 connects a gate electrode (top right corner) of the semiconductor chip 31 and a gate electrode (top left corner) of the semiconductor chip 32. The bonding wire 29o3 extends over the gap between the circuit patterns 24k and 24n and connects a gate electrode (top right corner) of the semiconductor chip 32 and a gate electrode (top left corner) of the semiconductor chip 36. The bonding wire 29o4 connects a gate electrode (top right corner) of the semiconductor chip 36 and a gate electrode (top left corner) of the semiconductor chip 35.

In addition, the bonding wire 29o5 connects the gate electrode (bottom right corner) of the semiconductor chip 31 and a gate electrode (top right corner) of the semiconductor chip 33. The bonding wire 2906 connects the gate electrode (top right corner) of the semiconductor chip 33 and a gate electrode (top left corner) of the semiconductor chip 34. The bonding wire 29o7 extends over the gap between the circuit patterns 24k and 24n and connects a gate electrode (top right corner) of the semiconductor chip 34 and a gate electrode (top left corner) of the semiconductor chip 38. The bonding wire 29o8 connects a gate electrode (top right corner) of the semiconductor chip 38 and a gate electrode (top left corner) of the semiconductor chip 37.

Thus, a gate voltage inputted from the circuit pattern 24m is applied to the semiconductor chip 31 via the bonding wire 29o1. This gate voltage is applied from the semiconductor chip 31 to the semiconductor chips 32, 36, and 35 in this order via the bonding wires 29o2 to 29o4. In addition, this gate voltage is applied from the semiconductor chip 31 to the semiconductor chips 33, 34, 38, and 37 in this order via the bonding wires 29o5 to 29o8.

In addition, along the bonding wires 29o2 to 29o4, bonding wires (their reference characters are omitted) for sense emitter wiring that are illustrated as dashed lines connect the sense electrodes (not illustrated) of the semiconductor chips 31, 32, 36, and 35. Along the bonding wires 2906 to 29o8, bonding wires (whose reference characters are omitted) for sense emitter wiring that are illustrated as dashed lines connect the sense electrodes (not illustrated) of the semiconductor chips 33, 34, 38, and 37. The bonding wire 29p1 for sense emitter wiring connects the sense electrodes (not illustrated) of the semiconductor chips 37 and 35. The bonding wire 29p2 for sense emitter wiring connects the sense electrode (not illustrated) of the semiconductor chip 35 and the circuit pattern 24p.

In addition, the bonding wires 29q1 connect the emitter electrodes of the semiconductor chips 31 and 33, the anode electrodes of the semiconductor chips 41 and 43, and the circuit pattern 24l. The bonding wires 29q2 connect the emitter electrodes of the semiconductor chips 32 and 34, the anode electrodes of the semiconductor chips 42 and 44, and the circuit pattern 24l. In addition, the bonding wires 29q4 connect the emitter electrodes of the semiconductor chips 36 and 38, the anode electrodes of the semiconductor chips 46 and 48, and the circuit pattern 24o. The bonding wires 29q3 connect the emitter electrodes of the semiconductor chips 35 and 37, the anode electrodes of the semiconductor chips 45 and 47, and the circuit pattern 24o.

In the case of the semiconductor device 10a according to the third embodiment, too, the semiconductor chips 31 to 34 and 35 to 38 include their respective gate electrodes at their respective corner portions on their respective front surfaces. The semiconductor device 10a includes the circuit pattern 24k on which the semiconductor chips 31 to 34 are disposed and the circuit pattern 24n on which the semiconductor chips 35 to 38 are disposed. In addition, the semiconductor device 10a includes the circuit pattern 24m near one of the sides of the semiconductor chip 31, excepting the sides near which the semiconductor chips 32 and 33 are disposed, and includes the circuit pattern 24p near one of the sides of the semiconductor chip 35, excepting the sides near which the semiconductor chips 36 and 37 are disposed.

As in the first embodiment, on the circuit pattern 24k, a bonding wire connects a gate electrode of the semiconductor chip 32 or 33 near the semiconductor chip 31 and a gate electrode of the semiconductor chip 31 near the semiconductor chip 32 or 33. In addition, a bonding wire connects a gate electrode of the semiconductor chip 32 or 33 near the semiconductor chip 34 and a gate electrode of the semiconductor chip 34 near the semiconductor chip 32 or 33. In FIG. 8, as an example, the bonding wires 29o2, 29o5, and 2906 connect these gate electrodes.

In addition, as in the first embodiment, on the circuit pattern 24n, a bonding wire connects a gate electrode of the semiconductor chip 35 or 38 near the semiconductor chip 36 and a gate electrode of the semiconductor chip 36 near the semiconductor chip 35 or 38. In addition, a bonding wire connects a gate electrode of the semiconductor chip 35 or 38 near the semiconductor chip 37 and a gate electrode of the semiconductor chip 37 near the semiconductor chip 35 or 38. In FIG. 8, as an example, the bonding wires 29o4 and 29o8 connect these gate electrodes.

In addition, according to the third embodiment, on the different circuit patterns 24k and 24n, gate electrodes of the semiconductor chips 36 and 38 near the semiconductor chips 32 and 34 are connected to gate electrodes of the semiconductor chips 32 and 34 near the semiconductor chips 36 and 38. In FIG. 8, as an example, the bonding wires 29o3 and 29o7 connect these gate electrodes.

Thus, as in the third embodiment, the length between the connection points of any one of the bonding wires, each of which connects gate electrodes of semiconductor chips disposed on the same circuit pattern 24k or 24n or on the different circuit patterns 24k and 24n, is short, and arches made by these bonding wires are low. Thus, even if the bonding wires come into contact with an external object, these bonding wires are not easily tilted.

In particular, according to the first to third embodiments, since semiconductor chips include gate electrodes at their respective corner portions on their respective front surfaces, inter-gate-electrode connection is achieved by bonding wires as described above. In addition, various wiring modes are achieved with these semiconductor chips.

According to the technique discussed herein, tilting of bonding wires is reduced, and deterioration of the reliability of a semiconductor device is thereby prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a first arm unit including:
      a first semiconductor chip having a first front surface and a first rear surface opposite to each other, and including a plurality of first control electrodes, each of which is disposed at a respective one of corner portions on the first front surface, a first output electrode disposed on the first front surface, and a first input electrode disposed on the first rear surface;
      a second semiconductor chip having a second front surface and a second rear surface opposite to each other, and including a plurality of second control electrodes, each of which is disposed at a respective one of corner portions on the second front surface, a second output electrode disposed on the second front surface, and a second input electrode disposed on the second rear surface, the second semiconductor chip being disposed adjacent to the first semiconductor chip;
      a first connection wire, connecting one of the first control electrodes to one of the second control electrodes, and
      a first circuit pattern having the first semiconductor chip and the second semiconductor chip disposed thereon; and
   a second arm unit including:
      a second circuit pattern extending in an arrangement direction along which the first semiconductor chip and the second semiconductor chip are arranged and being disposed adjacent to the first circuit pattern;
      a third semiconductor chip having a third front surface and a third rear surface opposite to each other, the third semiconductor chip being disposed on the second circuit pattern and including a plurality of third control electrodes, each of which is disposed at a respective one of corner portions of the third front surface, a third output electrode disposed on the third front surface, and a third input electrode disposed on the third rear surface;
      a fourth semiconductor chip having a fourth front surface and a fourth rear surface opposite to each other, the fourth semiconductor chip being disposed on the second circuit pattern and including a plurality of fourth control electrodes, each of which is disposed at a respective one of corner portions of the fourth front surface, a fourth output electrode disposed on the fourth front surface, and a fourth input electrode disposed on the fourth rear surface, the fourth semiconductor chip being disposed adjacent to the third semiconductor chip such that the third and fourth semiconductor chips are arranged along the arrangement direction; and
      a second connection wire connecting one of the third control electrodes to one of the fourth control electrodes, wherein the one of the first control electrodes connected to the first connection wire is disposed closer than the rest of the first control electrodes to the third semiconductor chip, and the one of the second control electrodes connected to the first connection wire is disposed closer than the rest of the second control electrodes to the fourth semiconductor chip, and the one of the third control electrodes connected to the second connection wire is disposed closer than the rest of the third control electrodes to the first semiconductor, and the one of the fourth control electrodes connected to the second connection wire is disposed closer than the rest of the fourth control electrodes to the second semiconductor chip.

2. The semiconductor device according to claim 1, wherein, the first connection wire connects the one among the first control electrodes and the one among the second control electrodes that are located mutually closest to each other.

3. The semiconductor device according to claim 1, further comprising:
   a first control circuit pattern, which is disposed adjacent to one of sides of the second semiconductor chip that does not face the first semiconductor chip; and
   a first input and output wire, which connects the first control circuit pattern to at least one of the second control electrodes, the at least one of the second control electrodes being located closer to the first control circuit pattern than to the first semiconductor chip.

4. The semiconductor device according to claim 3, wherein the first input and output wire connects the first control circuit pattern to one of the second control electrodes that is located closer to the first control circuit pattern than to the first semiconductor chip.

5. The semiconductor device according to claim 3, wherein the one side of the second semiconductor chip to which the first control circuit pattern is disposed is opposite to another side of the second semiconductor chip at which the first semiconductor chip is disposed.

6. The semiconductor device according to claim 3, wherein, the second connection wire connects the one among the third control electrodes and the one among the fourth control electrodes that are located mutually closest to each other.

7. The semiconductor device according to claim 6, wherein the second arm unit further includes a second control circuit pattern disposed adjacent to one of sides of the third semiconductor chip other than a side facing the fourth semiconductor chip, and a second input and output wire, which connects the second control circuit pattern and at least one of the third control electrodes located closer to the second control circuit pattern than to the fourth semiconductor chip.

8. The semiconductor device according to claim 1, wherein the first arm unit further includes first output wires, which connect the first output electrode and the second output electrode to the second circuit pattern and extend in a direction orthogonal to a direction in which the first connection wire extends.

9. The semiconductor device according to claim 1, wherein the second arm unit further includes a third circuit pattern, which is disposed adjacent to one side of the second circuit pattern that is opposite to another side of the second circuit pattern at which the first circuit pattern is disposed, and second output wires, which connect the third output electrode and the fourth output electrode to the third circuit pattern and extend in a direction orthogonal to a direction in which the second connection wire extends.

10. The semiconductor device according to claim 1, wherein the second circuit pattern includes a wiring area which is disposed at one side thereof that faces one side of the first circuit pattern that is opposite to another side of the first circuit pattern at which the second semiconductor chip is disposed, and the first arm unit further includes a first output wire which connects the first output electrode to the second output electrode and extends in a direction in which the first connection wire extends, to connect the first output electrode and the second output electrode to the wiring area of the second circuit pattern.

11. The semiconductor device according to claim 10, wherein the second arm unit includes a third circuit pattern which is disposed adjacent to yet another side of the second circuit pattern at which the fourth semiconductor chip is disposed and which is opposite to the one side of the second circuit pattern at which the wiring area is disposed, and a second output wire which connects the third output electrode to the fourth output electrode and extends in a direction in which the second connection wire extends, to connect the third output electrode and the fourth output electrode to the third circuit pattern.

12. The semiconductor device according to claim 1, wherein the first semiconductor chip, the second semiconductor chip, the third semiconductor chip, and the fourth semiconductor chip are reverse conducting insulated gate bipolar transistors (RC-IGBTs).

13. The semiconductor device according to claim 1, further comprising:
 a first circuit pattern on which the first semiconductor chip is disposed; and
 a second circuit pattern on which the second semiconductor chip is disposed, the second circuit pattern being disposed away from the first circuit pattern with a gap therebetween, wherein the first connection wire extends over the gap to connect one of the first control electrodes to one of the second control electrodes.

14. The semiconductor device according to claim 13, wherein, the first connection wire connects the one among the first control electrodes and the one among the second control electrodes that are located mutually closest to each other.

15. The semiconductor device according to claim 13, wherein the first semiconductor chip and the second semiconductor chip are insulated gate bipolar transistors (IGBTs).

* * * * *